(12) United States Patent
Lv

(10) Patent No.: US 9,741,275 B2
(45) Date of Patent: *Aug. 22, 2017

(54) PANEL DETECTION CIRCUIT AND DISPLAY PANEL

(71) Applicant: SHENZHEN CHINA STAR OPTOELECTRONICS TECHNOLOGY CO., LTD., Shenzhen (CN)

(72) Inventor: Qibiao Lv, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/416,771

(22) PCT Filed: Jul. 16, 2014

(86) PCT No.: PCT/CN2014/082355
§ 371 (c)(1),
(2) Date: Aug. 18, 2015

(87) PCT Pub. No.: WO2015/196522
PCT Pub. Date: Dec. 30, 2015

(65) Prior Publication Data
US 2016/0125775 A1 May 5, 2016

(30) Foreign Application Priority Data
Jun. 25, 2014 (CN) .......................... 2014 1 0290475

(51) Int. Cl.
G09G 3/00 (2006.01)
G01R 19/28 (2006.01)
G09G 3/36 (2006.01)

(52) U.S. Cl.
CPC ............. *G09G 3/006* (2013.01); *G01R 19/28* (2013.01); *G09G 3/3677* (2013.01);
(Continued)

(58) Field of Classification Search
CPC ......... G09G 2310/0264; G09G 3/3688; G09G 2330/12; G09G 3/3677; G09G 3/006; G01R 19/28
See application file for complete search history.

(56) References Cited

U.S. PATENT DOCUMENTS

2004/0017531 A1 1/2004 Nagata et al.
2004/0046920 A1 3/2004 Hayata et al.
(Continued)

FOREIGN PATENT DOCUMENTS

CN 101241281 A 8/2008
CN 101620818 A 1/2010
(Continued)

OTHER PUBLICATIONS

International Search Report (PCT/ISA220 and PCT/ISA210) and Written Opinion (PCT/ISA/237) dated Mar. 30, 2015, by the State Intellectual Property Office of China in corresponding International Application No. PCT/CN2014/082355. (14 pages).

*Primary Examiner* — Vijay Shankar
*Assistant Examiner* — Abhishek Sarma
(74) *Attorney, Agent, or Firm* — Buchanan Ingersoll & Rooney PC

(57) ABSTRACT

The present disclosure relates to a panel detection circuit and a display panel. The panel detection circuit comprises a source detection unit comprising a source testing line and several source switching units, a gate detection unit comprising a gate control line, a gate testing line and several gate switching unit, wherein the source switching unit and the gate switching unit each comprise at least two switching
(Continued)

elements to keep the source switching unit and the gate switching unit disenabled after the panel detection is completed.

10 Claims, 3 Drawing Sheets

(52) U.S. Cl.
CPC ... *G09G 3/3688* (2013.01); *G09G 2310/0264* (2013.01); *G09G 2330/12* (2013.01)

(56) References Cited

U.S. PATENT DOCUMENTS

| | | | |
|---|---|---|---|
| 2004/0100428 A1 | 5/2004 | Satoh | |
| 2005/0146349 A1* | 7/2005 | Lai | G09G 3/006 324/760.02 |
| 2007/0234151 A1 | 10/2007 | Hsu et al. | |
| 2009/0213288 A1* | 8/2009 | Chen | G02F 1/1303 349/43 |
| 2011/0095290 A1* | 4/2011 | Koo | G02F 1/1309 257/48 |
| 2015/0014686 A1 | 1/2015 | Lv | |
| 2015/0022211 A1 | 1/2015 | Du et al. | |
| 2015/0077681 A1 | 3/2015 | Li | |
| 2015/0120233 A1 | 4/2015 | Hsu et al. | |
| 2015/0325158 A1 | 11/2015 | Shao et al. | |

FOREIGN PATENT DOCUMENTS

| | | |
|---|---|---|
| CN | 102692774 A | 9/2012 |
| CN | 202736443 U | 2/2013 |
| CN | 103217844 A | 7/2013 |
| CN | 103345080 A | 10/2013 |
| CN | 103345914 A | 10/2013 |
| CN | 103544912 A | 1/2014 |
| JP | 2007-171993 A | 7/2007 |

* cited by examiner

PANEL DETECTION CIRCUIT AND DISPLAY PANEL

CROSS-REFERENCE TO RELATED APPLICATION

The present application claims benefit of Chinese patent application CN 201410290475.9, entitled "PANEL DETECTION CIRCUIT AND DISPLAY PANEL" and filed on Jun. 25, 2014, which is incorporated herein by reference.

TECHNICAL FIELD

The present disclosure relates to the technical field of liquid crystal display, and in particular to a panel detection circuit and a display panel using the same.

TECHNICAL BACKGROUND

Figure 1:
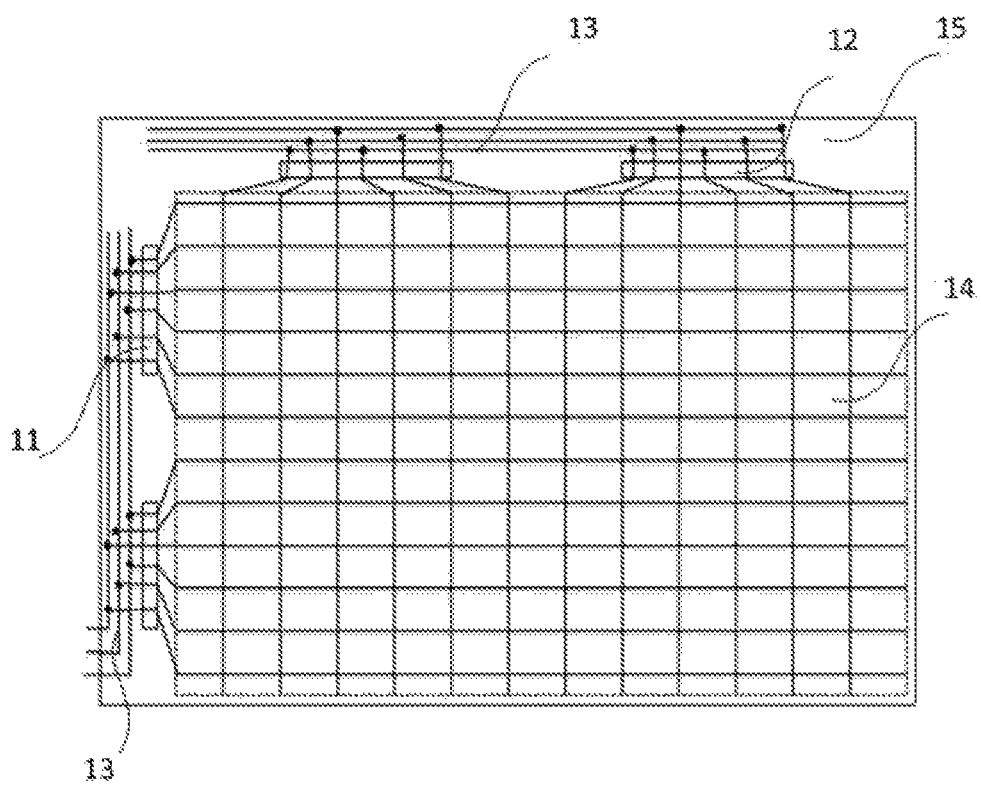

A thin film transistor liquid crystal display panel is the mainstream display device at present. In order to ensure the product quality, a cell test on the display cells inside the display panel is required in its assembling phase during manufacturing. FIG. 1 schematically shows the structure of a panel detection circuit in the prior art. The panel detection circuit is arranged on a substrate 15 of the display panel and comprises several shorting bars 13 disposed under a gate driver circuit 11 and a source driver circuit 12. Each shorting bar 13 is used to connect to scan lines, and alternatively, to data lines, so as to transmit an external scan line detection signal or data line detection signal to the display cells 14 in the display panel. The scan line detection signal and the data line detection signal light up the display cells 14 respectively, thereby determining whether the display panel functions properly.

After the detection of the display panel is completed, pins connected to the shorting bars 13 and located beneath the gate driver circuit 11 and the source driver circuit 12 should be cut off with laser, so that the display panel can display normal images. In order to realize a design of narrow frame of a display device, the shorting bars 13 should be further abraded off by means of edge grinding.

Therefore, with respect to the existing panel detection unit, the shorting bars 13 are required during the manufacturing, and should be cut off or even removed before leaving the factory. This causes increased production cost of the display panel in the prior art as well as lowered production efficiency.

For the above reasons, a panel detection unit and a display panel capable of lowering the production cost while improving the production efficiency are needed.

SUMMARY OF THE INVENTION

In order to solve the above problem, the present disclosure provides a panel detection circuit, comprising:

a source detection unit, comprising a source testing line and several source switching units, one end of each source switching unit being connected to the source testing line and the other end thereof being connected to a data line of a display panel, and a gate detection unit, comprising a gate control line, a gate testing line and several gate switching units, a first end of each gate switching unit being connected to the gate control line, a second end thereof being connected to the gate testing line, and a third end thereof being connected to a scan line of the display panel, wherein the source switching unit and the gate switching unit each comprise at least two switching elements to keep the source switching unit and the gate switching unit disenabled after the panel detection is completed.

In an embodiment of the present disclosure, the source switching unit comprises a first switching element and a second switching element in series connection, the first switching element and the second switching element being selected from a group consisting of transistors and diodes.

In an embodiment of the present disclosure, the source switching unit comprises a first transistor and a second transistor, the gate and source of the first transistor being connected to the source testing line, the gate and source of the second transistor being connected to the drain of the first transistor, and the drain of the second transistor being connected to a data line of the display panel.

In an embodiment of the present disclosure, the source switching unit comprises a first transistor and a diode, the gate and source of the first transistor being connected to the source testing line, the drain of the first transistor being connected to the anode of the diode, and the cathode of the diode being connected to a data line of the display panel.

In an embodiment of the present disclosure, the source switching unit comprises two diodes in series connection.

In an embodiment of the present disclosure, the gate switching unit comprises a third transistor and a fourth transistor, the gate of the third transistor being connected to the gate control line and the source thereof being connected to the gate testing line, the gate of the fourth transistor being connected to the gate control line and the source thereof being connected to the drain of the third transistor, and the drain of the fourth transistor being connected to a scan line of the display panel.

In an embodiment of the present disclosure, the source testing line is connected to a first low-potential driver unit, so that the source switching unit is disenabled after the detection of the panel is completed.

In an embodiment of the present disclosure, the gate control line is connected to a second low-potential driver unit, so that the gate switching unit is disenabled after the detection of the panel is completed.

In an embodiment of the present disclosure, the transistor is a TFT thin film field-effect transistor or a MOSFET transistor.

According to another aspect of the present disclosure, a display panel is provided, comprising:
  above-mentioned panel detection circuit,
  a plurality of scan lines and data lines arranged in a staggered manner,
  a display unit array connected to the scan lines and data lines,
  a gate driver circuit for providing scanning pulse signals to the scan lines, and
  a source driver circuit for providing data signals to the data lines.

As compared with the prior art, the present disclosure has the following beneficial effects: (1) at least two switching elements are arranged in each of the source detection unit and the gate detection unit, so as to make sure that the source switching units and the gate switching units are kept off during normal operation of the display panel, thereby preventing disturbance among the data lines (or scan lines) connected to the same testing line in case of the electric leakage from the switching units; (2) only one source testing line is arranged in the source detection unit to turn on the respective source switching units, and to transmit a source detection signal to each of the data lines through the respective source switching units, thereby reducing space occupied by the wiring in the source detection unit and facilitating the design of narrow frame of a display panel; (3) after the panel detection is completed, there is no need to remove the panel detection circuit from the display panel, nor to cut off the connections of the data lines and scan lines with the source testing line, the gate control line and the gate testing line, thereby simplifying the production steps and saving production time.

Other features and advantages of the present disclosure will be further explained in the following description, and are partially become more readily evident therefrom, or be understood through implementing the present disclosure. The objectives and advantages of the present disclosure will be achieved through the structure specifically pointed out in the description, claims, and the accompanying drawings.

BRIEF DESCRIPTION OF THE ACCOMPANYING DRAWINGS

Figure 2:
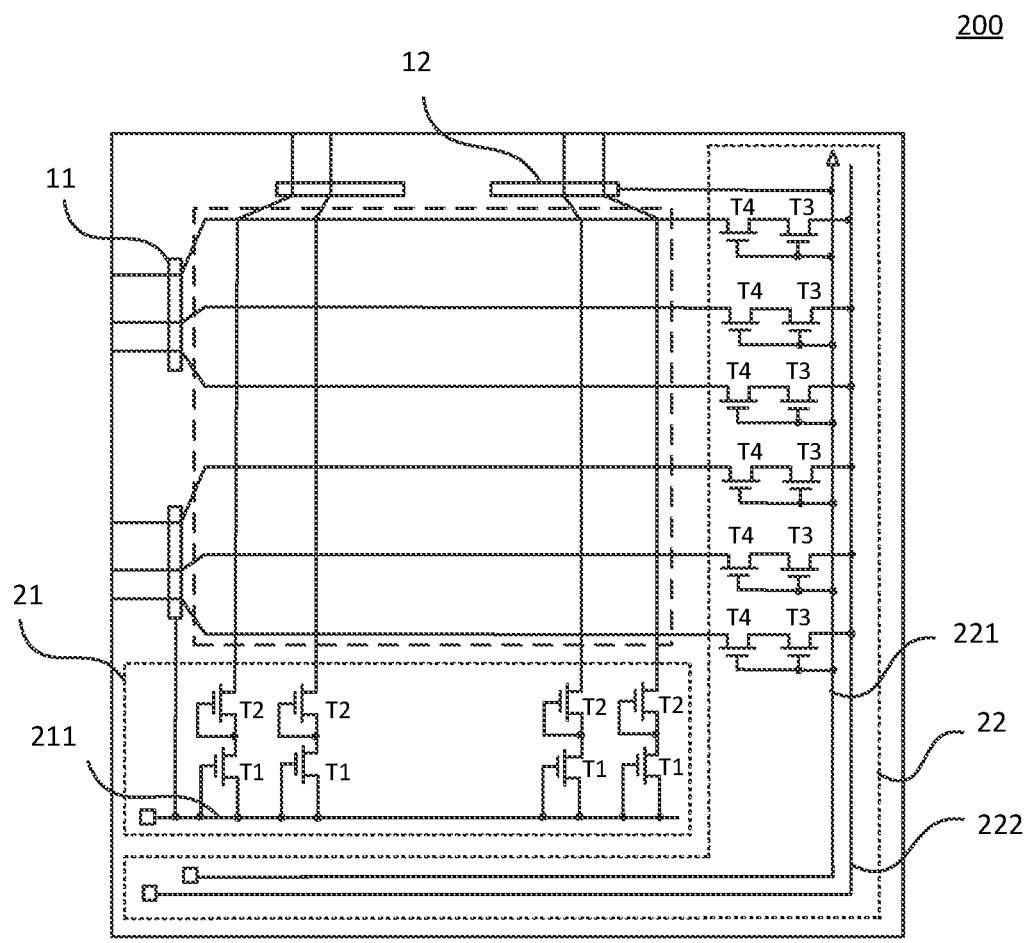
Figure 3A:
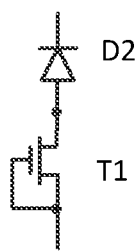
Figure 3B:
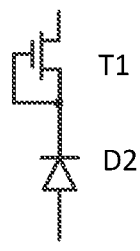
Figure 3C:
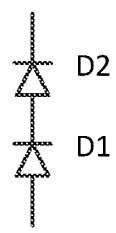

In order to clarify the technical solutions of the embodiments of the present disclosure, the accompanying drawings relating to the embodiments will be described briefly as follows:

FIG. 1 schematically shows a panel detection circuit in the prior art;

FIG. 2 schematically shows the structure of a display panel according to example 1 of the present disclosure;

FIG. 3a schematically shows a source switching unit according to example 2 of the present disclosure;

FIG. 3b schematically shows another source switching unit according to example 2 of the present disclosure; and FIG. 3c schematically shows still another source switching unit according to example 2 of the present disclosure.

DETAILED DESCRIPTION OF THE EMBODIMENTS

The present disclosure will be explained in detail with reference to the embodiments and the accompanying drawings, whereby it can be fully understood about how to solve the technical problem by the technical means according to the present disclosure and achieve the technical effects thereof, and thus the technical solution according to the present disclosure can be implemented. It is important to note that as long as there is no structural conflict, various embodiments as well as the respective technical features mentioned herein may be combined with one another in any manner, and the technical solutions obtained all fall within the scope of the present disclosure. In the drawings, elements with similar structure are referred to the same reference numeral.

EXAMPLE 1

FIG. 2 schematically shows the structure of a display panel 200 according to example 1. The display panel 200 comprises a number of scan lines and data lines arranged in a staggered manner, a display unit array (not shown in FIG. 2) connected to the scan lines 17 and the data lines 18, a gate driver circuit 11, and a source driver circuit 12. In this case, the gate driver circuit 11 provides scanning pulse signals to the scan lines, and the source driver circuit 12 provides data signals to the data lines separately, so that the display cells can display images. The display panel 200 further comprises a panel detection circuit having a source detection unit 21 and a gate detection unit 22.

The display panel 200 can be selected from a group consisting of a thin film transistor liquid crystal display panel (TFT-LCD), an organic LED (OLED) display panel, and a polymeric LED display panel (PLED), and the like.

The source detection unit 21 is arranged at an opposite side relative to the source driver circuit 12 of the display panel 200, and comprises a source testing line 211 and a number of source switching units. In example 1, the source switching units each comprise transistors T1 and T2. As shown in FIG. 2, the gate and source of T1 are connected to the source testing line 211, the gate and source of T2 are connected to the drain of T1, and the drain of T2 is connected to a data line of the display panel.

During the test of the display panel, a forward-bias voltage is applied through the source testing line 211 so as to turn on the transistors T1 and T2 of the source switching unit, thereby inputting a source detection signal to the respective data lines.

The panel detection circuit in the prior art is usually provided with a source control line and a source testing line, the source control line controls the source switching units to turn on, so that a source detection signal can be transmitted to the respective data lines through the source switching units. Since the detection signal on the sources are all forward bias, only one source testing line is provided in the present disclosure, via which testing line the source switching units can be turned on by a source detection signal, so that the source detection signal is transmitted to the respective data lines through the source switching units. In this case, space occupied by wires in the source detection unit 21 can be reduced, thereby facilitating the design of a narrow frame display panel.

The gate detection unit 22 comprises a gate control line 221, a gate testing line 222, and several gate switching units. The gate switching units are arranged at an opposite side relative to the gate driver circuit 11 of the display panel 200, and the gate control line 221 and the gate testing line 222 extend from the opposite side relative to the gate driver circuit 11 of the display panel 200 to an opposite side relative to the source driver circuit 12.

In example 1, the gate switching units each comprise transistors T3 and T4. As shown in FIG. 2, the gate of the transistor T3 is connected to the gate control line 221 and the source thereof is connected to the gate testing line 222. The gate of the transistor T4 is connected to the gate control line 221 and the source thereof is connected to the drain of T3. The drain of transistor T4 is connected to a scan line of the display panel. As a result, a first end of each gate switching unit is connected to the gate control line, a second end thereof is connected to the gate testing line, and a third end thereof is connected to the scan line of the display panel.

During the display panel detection, a forward bias voltage is applied through the gate control line 221 so as to turn on the transistors T3 and T4 of each of the gate switching units, thereby inputting a gate detection signal into the respective scan lines. The gate detection signal can be forward bias or reverse bias.

In the prior art, the source switching units and the gate switching units each are typically single TFT switch. Once the TFT switch fails and electric leakage occurs, the signals on the data lines (or the signals on the scan lines) connected to the same testing line would disturb with one another during normal operation of the display panel, causing display abnormality.

In example 1, each of the source switching unit and the gate switching unit comprises at least two transistors. Even when electric leakage occurs to one of the transistors, the other transistor can still keep either the source switching unit or the gate switching unit off. Therefore, the risk of leakage can be lowered by means of the panel detection circuit according to the present disclosure.

A person skilled in the art should understand that the source switching unit and the gate switching unit each can comprise three or more transistors in order to achieve better effect of preventing electric leakage. However, the more transistors being provided, the more space it would require to accommodate the wiring in the source detection unit and the gate detection unit, which is adverse to the design of narrow frame of a display panel.

In practical application, after the panel detection is completed, there is no need to remove the panel detection circuit of example 1 from the display panel 200, nor to cut off the connections of the data lines and scan lines with the source testing line, the gate control line and the gate testing line, thereby simplifying the production steps and saving production time.

Furthermore, in order to make sure that the source switching units and the gate switching units are kept off after the panel detection is completed, the source testing line 211 is connected to a first low-potential driver unit and the gate control line 221 is connected to a second low-potential driver unit. The first low-potential driver unit and the second low-potential driver unit either provide negative voltages or directly ground, so that voltages of the source testing line 211 and of the gate control line 221 are kept low when the display panel is in normal use, thereby keeping the source switching units and the gate switching units off.

In this example 1, as shown in FIG. 2, the source testing line 211 is connected to the gate driver circuit 11, and the gate control line 221 is connected to the source driver circuit 12. Low potentials are provided by the gate driver circuit 11 and the source driver circuit 12 respectively.

EXAMPLE 2

Example 2 provides a plurality of implementing forms of a source switching unit. The source switching unit, as shown in FIG. 3a, comprises a transistor T1 and a diode D2. The gate and source of the transistor T1 are connected to the source testing line and the drain of T1 is connected to the anode of the diode D2, and the cathode of the diode D2 is connected to a data line of the display panel. During the display panel detection, a forward bias voltage is applied through the source testing line 211 so as to turn on the transistor T1 and the diode D2 in the source switching unit, thereby inputting a source detection signal into the data line.

The source switching unit, as shown in FIG. 3b, comprises a transistor T1 and a diode D2. The anode of diode D2 is connected to the source testing line and the cathode thereof is connected to the gate and source of the transistor T1, and the drain of T1 is connected to a data line of the display panel. During the display panel detection, a forward bias voltage is applied through the source testing line 211 so as to turn on the diode D2 and the transistor T1 in the source switching unit, thereby inputting a source detection signal into the data line.

The source switching unit as shown in FIG. 3c comprises a diode D1 and a diode D2. The anode of the diode D1 is connected to the source testing line and the cathode thereof is connected to the anode of the diode D2, and the cathode of D2 is connected to a data line of the display panel. During the display panel detection, a forward bias voltage is applied through the source testing line 211 so as to turn on the diodes D1 and D2 in the source switching unit, thereby inputting a source detection signal into the data line.

It is easy for a person skilled in the art to understand that the transistors used in the examples of the present disclosure can be TFT thin film transistors, MOSFET transistors, or other elements which can act as substitutes.

While the preferred embodiments of the present disclosure have been described above, they are merely for better understanding the present disclosure and should not be construed as limitations thereof. Any one skilled in the art can make various modifications and variants to the implementing forms and details of the present disclosure, without departing from the scope and spirit of the present disclosure. The scope of the present disclosure should still be subjected to the scope defined in the claims.

The invention claimed is:

1. A panel detection circuit, comprising:
    a source detection unit, comprising only one source testing line and several source switching units, one end of each source switching unit being connected to the source testing line and the other end thereof being connected to a data line of a display panel, and
    a gate detection unit, comprising a gate control line, a gate testing line and several gate switching units, a first end of each gate switching unit being connected to the gate control line, a second end thereof being connected to the gate testing line, and a third end thereof being connected to a scan line of the display panel,
    wherein the source switching unit and the gate switching unit each comprise at least two switching elements to keep the source switching unit and the gate switching unit disenabled after the panel detection is completed;
    wherein the source switching unit comprises a first transistor and a second transistor, the gate and source of the first transistor being connected to the source testing line, the gate and source of the second transistor being connected to the drain of the first transistor, and the drain of the second transistor being connected to a data line of the display panel.

2. The panel detection circuit according to claim 1, wherein the gate switching unit comprises a third transistor and a fourth transistor, the gate of the third transistor being connected to the gate control line and the source thereof being connected to the gate testing line, the gate of the fourth transistor being connected to the gate control line and the source thereof being connected to the drain of the third transistor, and the drain of the fourth transistor being connected to a scan line of the display panel.

3. The panel detection circuit according to claim 2, wherein the source testing line is connected to a first low-potential driver unit, so that the source switching unit is turned off after the detection of the panel is completed.

4. The panel detection circuit according to claim 2, wherein the gate control line is connected to a second low-potential driver unit, so that the gate switching unit is turned off after the detection of the panel is completed.

5. The panel detection circuit according to claim 2, wherein the transistors are TFT thin film field-effect transistors or MOSFET transistors.

6. A display panel, comprising:
    a panel detection circuit comprising a source detection unit and a gate detection unit, the source detection unit comprising only one source testing line and several source switching units, one end of each source switching unit being connected to the source testing line and the other end thereof being connected to a data line of a display panel, the gate detection unit comprising a gate control line, a gate testing line and several gate switching units, a first end of each gate switching unit being connected to the gate control line, a second end thereof being connected to the gate testing line, and a third end thereof being connected to a scan line of the display panel, wherein the source switching units and the gate switching units each comprise at least two switching elements to keep the source switching units and the gate switching units disenabled after the panel detection is completed, a plurality of scan lines and data lines arranged in a staggered manner, a display unit array connected to the scan lines and data lines, a gate driver circuit for providing scanning pulse signals to the scan lines, and a source driver circuit for providing data signals to the data lines;

wherein the source switching unit comprises a first transistor and a second transistor, the gate and source of the first transistor being connected to the source testing line, the gate and source of the second transistor being connected to the drain of the first transistor, and the drain of the second transistor being connected to a data line of the display panel.

7. The display panel according to claim 6, wherein the gate switching unit comprises a third transistor and a fourth transistor, the gate of the third transistor being connected to the gate control line and the source thereof being connected to the gate testing line, the gate of the fourth transistor being connected to the gate control line and the source thereof being connected to the drain of the third transistor, and the drain of the fourth transistor being connected to a scan line of the display panel.

8. The display panel according to claim 7, wherein the source testing line is connected to a first low-potential driver unit, so that the source switching unit is turned off after the detection of the panel is completed.

9. The display panel according to claim 7, wherein the, gate control ling is connected to a second low-potential driver unit, so that the gate switching unit is turned off after the detection of the panel is completed.

10. The display panel according to claim 7, wherein the transistors are TFT thin film field-effect transistors or MOSFET transistors.

* * * * *